United States Patent [19]

Horel et al.

[11] Patent Number: 4,862,077

[45] Date of Patent: Aug. 29, 1989

[54] PROBE CARD APPARATUS AND METHOD OF PROVIDING SAME WITH RECONFIGURABLE PROBE CARD CIRCUITRY

[75] Inventors: Timothy A. Horel, Fletcher; Edward S. Hoyt; Lloyd A. Walls, both of Williston, all of Vt.

[73] Assignee: International Business Machines Corporation, Armonk, N.Y.

[21] Appl. No.: 311,448

[22] Filed: Feb. 13, 1989

Related U.S. Application Data

[63] Continuation of Ser. No. 43,789, Apr. 29, 1987, abandoned.

[51] Int. Cl.[4] ........................ G01R 1/04; G01R 1/067

[52] U.S. Cl. ................................ 324/158 F; 324/72.5; 324/73 PC; 324/158 P

[58] Field of Search .............. 324/72.5, 73 PC, 158 P, 324/158 F

[56] References Cited

U.S. PATENT DOCUMENTS

| | | | |
|---|---|---|---|
| 3,806,801 | 4/1974 | Bove | 324/158 F |
| 3,866,119 | 2/1975 | Ardezzone et al. | 324/158 F |
| 3,963,986 | 6/1976 | Morton et al. . | |
| 4,038,599 | 7/1977 | Bove et al. | 324/158 F |
| 4,471,298 | 9/1984 | Frohlich | 324/73 PC |
| 4,488,111 | 12/1984 | Widdowson | 324/158 P |
| 4,518,914 | 5/1985 | Okubo et al. | 324/158 F |
| 4,523,144 | 6/1985 | Okubo et al. . | |
| 4,551,673 | 11/1985 | Barth et al. | 324/158 F |
| 4,574,236 | 3/1986 | Hechtman | 324/158 P |
| 4,724,377 | 2/1988 | Maelzer et al. | 324/158 P |

FOREIGN PATENT DOCUMENTS

| | | | |
|---|---|---|---|
| 0131375 | 1/1985 | European Pat. Off. . | |
| 2451871 | 5/1976 | Fed. Rep. of Germany | 324/158 P |
| 2300486 | 3/1976 | France . | |

OTHER PUBLICATIONS

Patent Abstracts of Japan, vol. 7, No. 42, (P177) [1187] Feb. 19, 1983.

JP-A-57 194 367 (Hitachi Seisakusho K.K.) 29-11-82.

JP-A-60-242 379 (Matsushita Denki Sangyo K.K.) 2-12-85.

PCT International Publication WO 80/00101, "Probe and Interface Device for Integrated Circuit Wafers," dated 24th Jan. 1980 (Cerprobe Corp.).

IBM Technical Disclosure Bulletin, vol. 18, No. 8, Jan. 1976 pp. 2487-2488.

*Primary Examiner*—Reinhard J. Eisenzopf
*Assistant Examiner*—W. Burns
*Attorney, Agent, or Firm*—Sughrue, Mion, Zinn, Macpeak & Seas

[57] ABSTRACT

A probe card apparatus and method which allows reconfiguration of the probing circuits. A first probe card member has a plurality of incomplete probing circuits which are associated with a plurality of contact holes. An adapter ring member, having a plurality of T-shaped conductive lines terminated in contact holes, is removably mounted in close proximity to the first probe card member. Spring-loaded contact pins provide contact between the members such that the T-shaped conductive lines are used to complete the probing circuit. The T-shaped conductive lines are severable lines, and discrete electronic components can be connected between respective contact holes. As the adapter ring member is of a removably attachable construction, the entire probe card circuitry is reconfigurable by a simple change of the adaptor ring.

21 Claims, 5 Drawing Sheets

FIG.2B
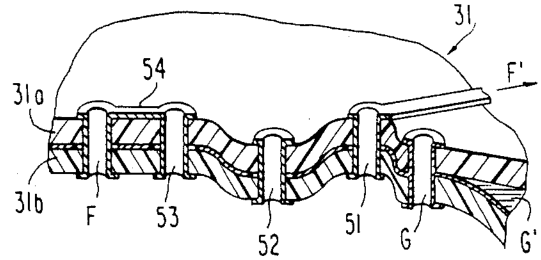
FIG.2C
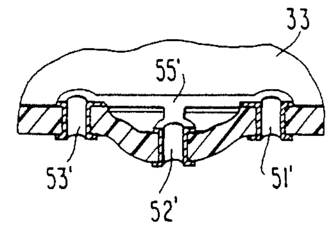
FIG.3C
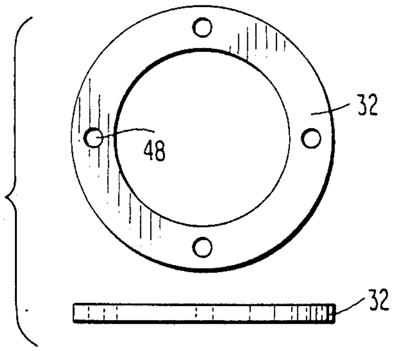
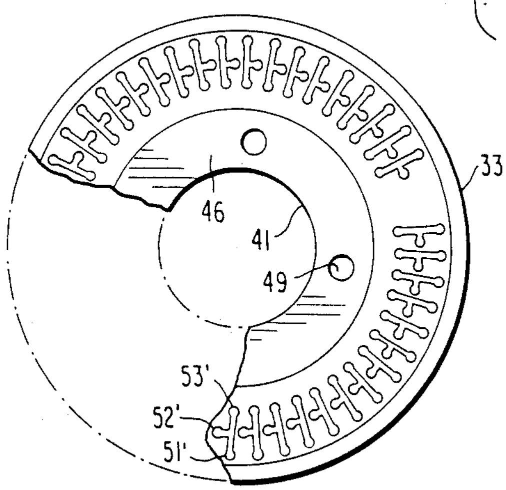
FIG.3D
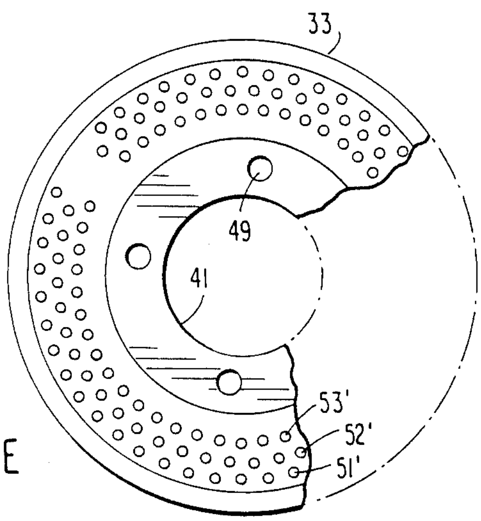
FIG.3E

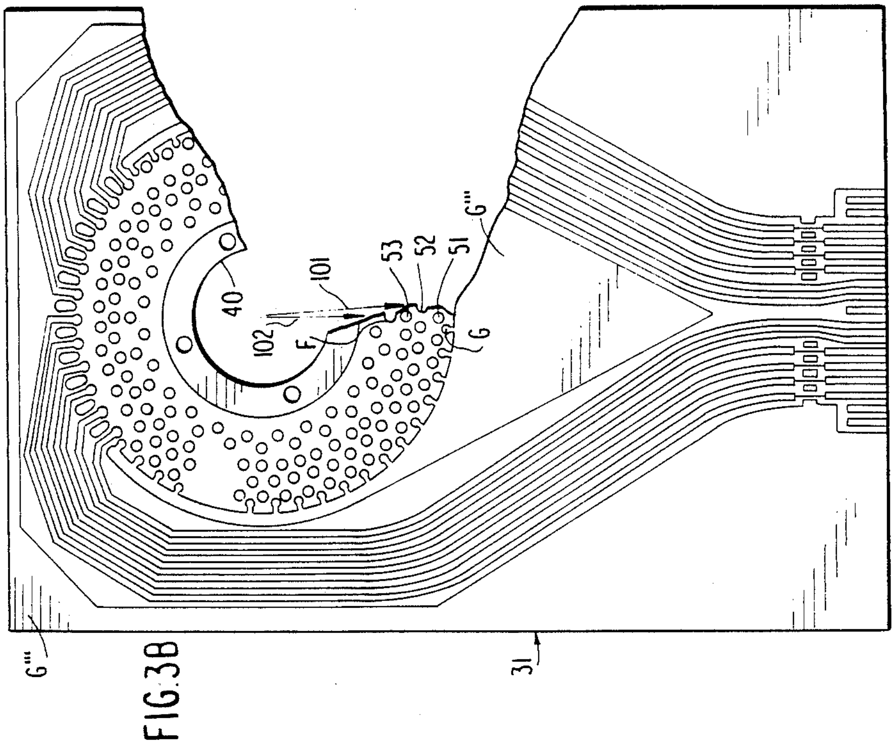
FIG. 3B
FIG. 3A
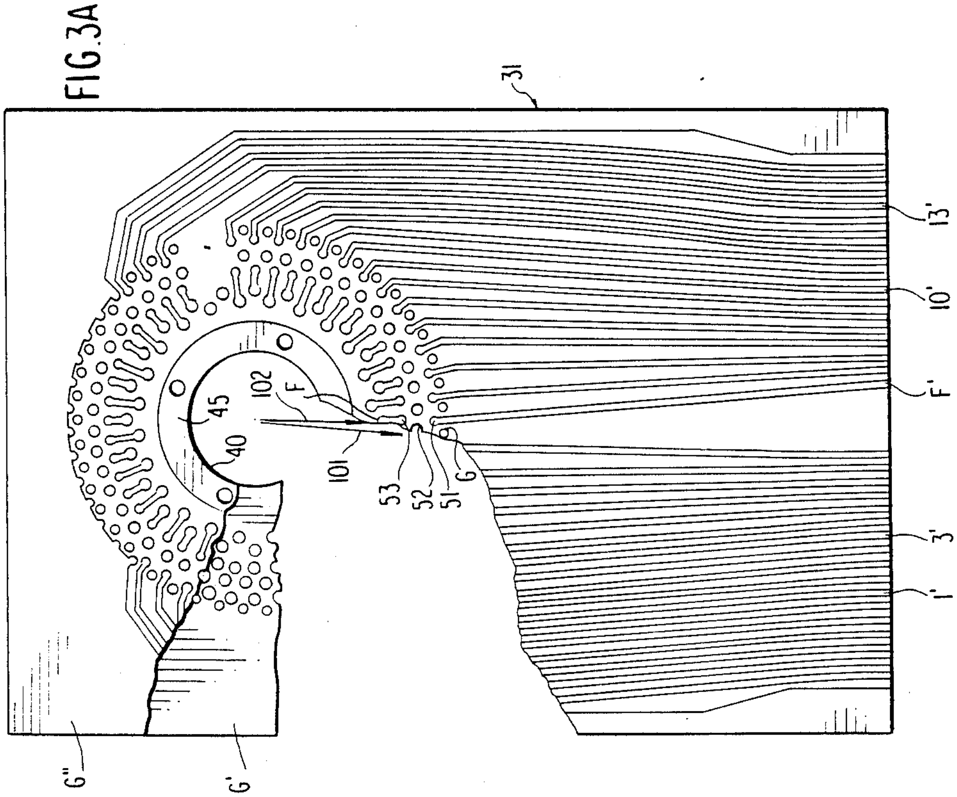

TERMINATED INPUT LINE

OUTPUT PROBE LINE

NONTERMINATED I/O LINE

CURRENT SENSE PROBE

PROBE CARD APPARATUS AND METHOD OF PROVIDING SAME WITH RECONFIGURABLE PROBE CARD CIRCUITRY

This is a continuation of application Ser. No. 07/043,789 filed April 29, 1987, now abandoned.

TECHNICAL FIELD

The present invention relates to a probe card apparatus and method of providing same with reconfigurable probe card circuitry.

BACKGROUND ART

During the manufacturing of semiconductor circuits, there is often a need to make temporary electrical connection to conduct testing operations. To allow this connection, the semiconductor circuit is fabricated with a plurality of miniature test contact pads at various locations on the surface of the silicon wafer. A probe card, having a plurality of needle-like probe pins, is then used to mechanically contact, and make electrical connection to, the test contact pads.

In using the probe pins to make connection to the semiconductor circuits, it is critical that the probe pins be aligned in two respects. First, the configuration of the probe pin tips must be such that it exactly matches the configuration of the test contact pads. Second, the respective probe pin tips must be on proper planar levels such that all the contact pins will make contact with the respective test contact pads at substantially the same time. It should be noted that tremendous skill and expertise must be used to make these critical alignments. Once aligned, the probe card represents a very delicate apparatus since the probe pins are very easily bent.

Another important feature of the probe card is the probe card circuitry which is comprised of a plurality of probe circuits, each of the respective probe circuits being associated with respective one of the probe pins. Although there is a tremendous number of probe circuit variations, the probe circuit associated with each probe pin is usually dependent on the type of semiconductor circuit to be tested and, also, on the type of test which is to be applied. As a result of the above dependencies, the probe circuits for the respective probe pins must be changed every time the semiconductor circuit type or testing operation is changed.

In the past, probe cards were fabicated as permanent structures; i.e., with probe circuits and probe pins which were an integral part of, or permanently attached to, the probe card. This approach is disadvantageous in a number of respects. First, there is a tremendous expense in fabricating, performing critical alignment, storing and indexing a large number of probe cards. Since these probe cards are not reconfigurable, a separate card has to be fabricated for every variation of probe card circuitry, even though a minor circuit change might have rendered an existing probe card suitable.

There is even a more important disadvantage. The excessive handling required by having to dismount and mount a large number of different probe cards results in a substantial increase in the probability that either improper testing will occur, or damage will be done to the very delicate semiconductor circuit or probe card. Furthermore, the dismounting and remounting of the probe pins from contact with the semiconductor circuit is an especially inefficient operation in cases where a series of different tests must be applied to the same semiconductor circuit.

One prior art appraoch, which has overcome several of these shortcomings, is that disclosed in PCT International Publication WO 80/00101, entitled "Probe and Interface Device for Integrated Circuit Wafers," dated 24th January, 1980 (Cerprobe Corp.). This prior art approach will be illustrated and described with reference to FIG. 1A–1C.

In FIG. 1A, there is shown a simplified top view of the prior art probe device 100 attached to coupling connector 102. Extending from the connector 102 are metalized portions 104 leading to a circular aperture 106. An enlarged view of this circular aperture 106 is shown in FIG. 1B.

Projecting toward the center of this circular aperture 106 is a plurality of probe members 110 which are attached to a plurality of respective holding means 112 which are removably maintained in respective holding grooves 114 and are electrically connected to respective metalized portions 104.

Turning now to FIG. 1C, there is shown an enlarged view of one of the holding means 112 which has an L-shape and has probing circuitry 116 which is electrically connected to the probe member 110. As the probing circuitry for a respective probe member 110 is formed on the removable holding means 112, it can be seen that the probe device 100 can be reconfigured to a different probe card circuitry.

This feature offers advantages over the permanent probe card approach in a number of respects. First, versatility is achieved in that the probe device 100 may be reconfigured or repaired by replacing any of the respective holding means 112. Thus, regardless of whether a slight or a major change is required, the probing device 100 can be reconfigured. As a further advantage, tremendous manufacturing savings are realized, as it is cheaper to manufacture the simpler L-shape holding means structures rather than an entire probe device.

Although the approach of FIGS. 1A–1C represents an improvement over the permanent probe card approach, it has been found still to be disadvantageous in several respects. First, in order for the probe card circuitry to be reconfigured, up to 24 individual L-shaped holding means 112 have to be removed from the holding grooves 114 and, then, replaced with new holding means. During replacement of the respective holding means 112, great skill and expertise must be used to align each of the new probing members 110 with respect to the other probing members. This operation is very time consuming, and there exists the danger that neighboring probing members 110 will be mechanically contacted and that the critical alignment will be disturbed.

As a further disadvantage, the probing device 110 must be dismounted from contact with the semiconductor circuit, reworked and remounted every time a change in the testing operation is to occur. Again, this is a particularly inefficient approach where a series of probing tests are to be applied to the same semiconductor circuit.

As a result of the deficiencies in the prior art, there has long existed the need for a probe card apparatus and method which allows convenient reconfiguration of the probe circuits. Furthermore, there has long existed a need for a probe card apparatus and method which facilitates reconfiguration without replacement of the probe pins, and without having to remove the probe pins from contact with the test contact pads.

SUMMARY OF THE INVENTION

Consequently, an object of the present invention is to provide a probe card apparatus and method which allow convenient reconfiguration of the probe card circuitry.

Another object of the invention is to provide a probe card apparatus and method which allow reconfiguration without replacement of the probe pins.

An additional object of the invention is to provide a probe card apparatus and method which maintains a constant characteristic impedance and low insertion loss so that the probing interface can be reconfigured.

A further object of the invention is to provide a probe card apparatus and method which allow reconfiguration of the probe card circuitry without the need to remove the probe pins from contact with the test contact pads.

Another object of the invention is to provide a probe card apparatus and method which avoid the need to dismount, readjust and remount the probe card in order to reconfigure the probe card circuitry.

Another object is to provide a probe card apparatus and method whereby a large number of different probe cards need not be fabricated or stored.

A further object of the invention is to provide a probe card apparatus and method whereby the handling of the probe card during reconfiguration of the probe card circuitry is minimized.

Still another object is to provide a probe card apparatus and method whereby the probe card circuitry can be conveniently reconfigured regardless of whether a small number or all of the probe circuits are changed.

These and other objects of the present invention are realized in a probe card apparatus using a probe card construction comprise of several structural members. The first probe card member is a rectangular printed circuit board having a plurality of conductive lines representing interrupted circuits. Each of the interrupted circuits is associated with a respective probe pin and has plurality of contact holes at the location where the circuit is interrupted. The second probe card member is a printer circuit adapter ring having a plurality of T-shaped conductive line circuitries. Each of the T-shaped conductive line circuitries has a plurality of contact holes designed, such that, if the adapter ring is placed in a proper position relative to the first contact member, the contact holes of the respective interrupted conductive lines will be in alignment with the contact holes of the respective T-shaped conductive lines. Attachment means and spring loaded contact pins are provided such that the adapter ring can be mounted in a fixed position relative to the first contact member, and such that electrical contact can be maintained between the first probe card member and the adapter ring. The T-shaped conductive lines represent severable lines, and the contact holes represent sites where discrete electronic components can be attached, whereby the probing circuitry for a respective probing pin can be reconfigured to any desired circuit.

BRIEF DESCRIPTION OF THE DRAWINGS

The foregoing and other approaches and teachings of the present invention will become more apparent from the following detailed description of the the preferred embodiment for carrying out the invention. In the description to follow, reference will be made to the accompany drawings in which:

FIGS. 2B–2C are enlarged partial cut away views illustrating important structural features of the preferred embodiment illustrated in FIG. 2A.

FIGS. 3A–3B are partial cut away-views illustrating the top and bottom printed circuit layout of the preferred first probe card member of the present invention.

FIG. 3C shows a top and side view of the preferred spacer ring of the present invention.

FIGS. 3D–3E are partial cut-away views of the top and bottom printed circuit layouts of the preferred adapter ring of the present invention.

DESCRIPTION OF THE PREFERRED EMBODIMENT

Before beginning a discussion of the probe card apparatus and method of the present invention, it should be understood that the height, width and thickness dimensions shown in FIGS. 2A–2C and 3A–3E are for the sake of example and clarity only, and are not intended to designate relative or actual dimensions; i.e., some dimensions may be exaggerated to improve the clarity of the illustrations. Typical dimensions which are known will be revealed in the following description.

Figure 1A:
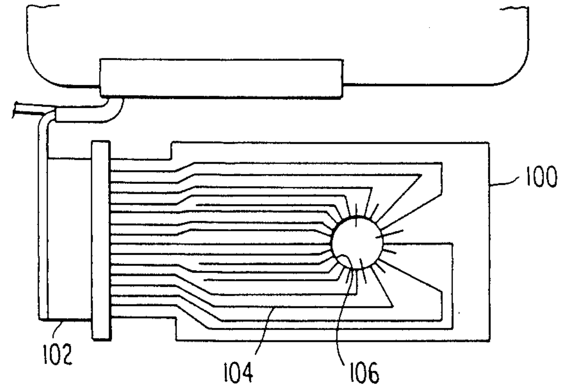
FIGS. 1A–1C are various views of a prior art probe device.
Figure 1B:
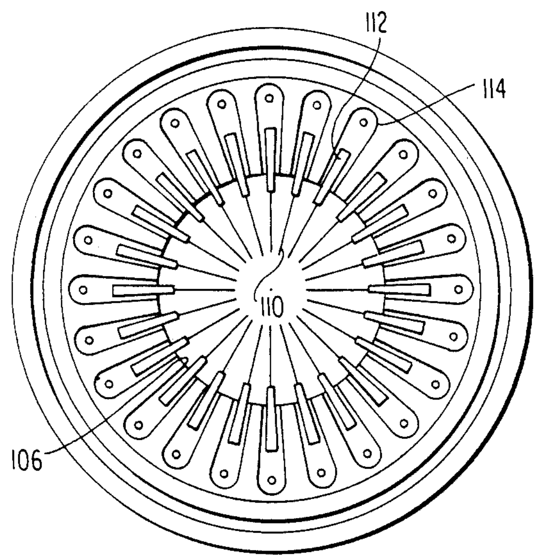
Figure 1C:
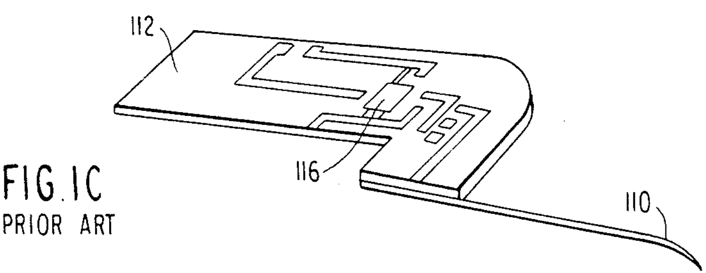
Figure 2A:
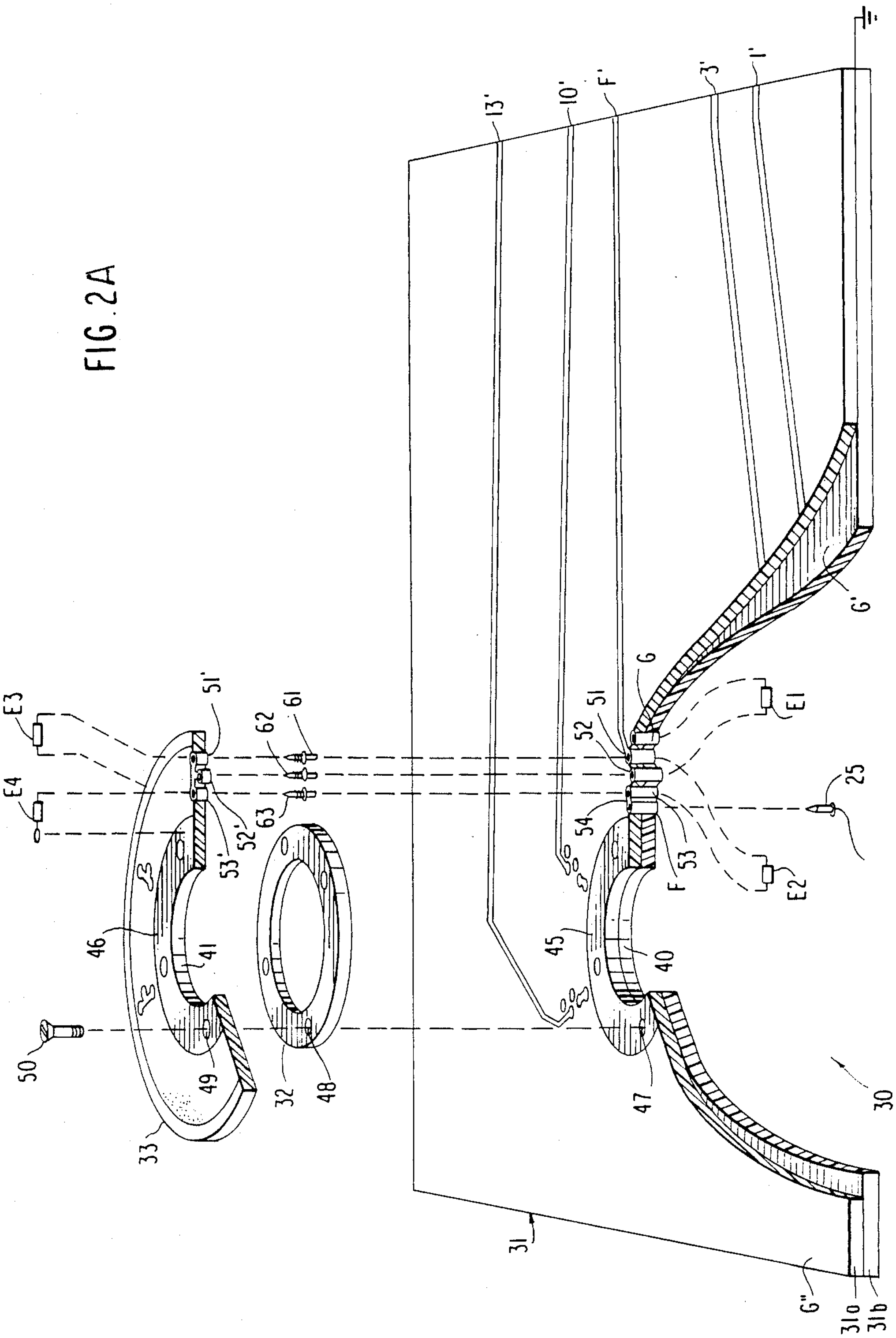
FIG. 2A is a simplified exploded and partial cut away view illustrating the components and structural arrangement of a preferred embodiment of the present invention.

Turning now to a detailed description, a preferred embodiment of a probe card apparatus of the present invention will be described with reference to FIGS. 2A–2C, and 3A–3E. In FIGS. 3A–3E, there are shown detailed and/or cut away views of the various components and circuit lay-outs of a probe card apparatus of the present invention. FIG. 2A is a simplified perspective exploded view illustrating the arrangement of these components; FIGS. 2B and 2C are enlarged views which illustrate specific details.

As will become apparent from the description to follow, the probe card printed circuit layouts of FIGS. 3A–3E define a plurality of probing circuits, each of which is to be associated with a respective probe pin. In the preferred layout illustrated, there are 48 probing circuits which can be associated with 48 probe pins. For simplicity of illustration and description, FIG. 2A has been illustrated with only a sample of the probing circuits formed in the actual printed circuit layout shown in FIGS. 3A–3E. To further simplify the description, only one of these sample circuits is used to describe an exemplary probing circuit. While the focus of the following description will be on this exemplary probing circuit, it is to be understood that the description applies equally as well to each respective one of the plurality of probing circuits.

Turning now to FIG. 2A, there is shown a probe card 30 which represents a preferred structural arrangement of a probe card apparatus of the present invention. The probe card 30 has been shown in an exploded, cut away view to illustrate important details. Main components of the preferred probe card 30 include: a first probe card member 31, a spacer ring 32, spring-loaded contact pins 61, 62, 63 and an adapter ring 33. These components will be now be described in greater detail.

The first probe card member 31 may also be called a first printed circuit board, a first plate or a mother board; however, for the purposes of this application, the term "first probe card member" will be consistently used.

The first probe card member 31 is actually a multi-layered printed circuit board comprising a number of conductive lines which are terminated with contact holes or terminals. The top and bottom printed circuit layout of the preferred embodiment can be seen in the cut away views of FIGS. 3A and 3B, respectively. Although the first probe card member 31 may be of any convenient geometrical shape, in a preferred embodiment this component is rectangular as illustrated.

In the illustrations of the first probe card member 31, the printed circuit layout pattern represents conductive areas formed on the multi-layered printed circuit board. In a preferred embodiment, these conductive lines are formed of copper of specific deminsions required to create constant impedance lines which, additionally, may be gold-plated to minimize resistance. As one example, the first probe card member 31 can be an epoxy board with a dielectric constant of approximately 5, and which has been plated with copper such that the resultant thickness of the first probe card member is approximately 0.062 inch, with line widths of approximately 0.055 inch, and having an internal copper plane located approximately 0.031 inch beneath the lines.

As is apparent from the top and bottom printed circuit layouts of FIGS. 3A and 3B, the conductive areas are formed on both major surfaces of the first probe card member 31. Corresponding conductive areas on these two major surfaces are often electrically interconnected using holes drilled throughout the printed circuit board, which holes are then plated with copper or gold to provide the electrical connection.

The first probe card member 31 is a multi-layered printed circuit board constructed of a first board 31*a* and a second board 31*b*. Sandwiched between this first board 31*a* and second board 31*b* is a central ground plane G', which is actually a printed circuit conductive area formed on the centrally facing surface of either the first board 31*a* or the second board 31*b*. In a preferred embodiment, the layout of the central ground plane G' is a conductive material layer on the entire centrally facing surface, except for provisions which must be made for non-grounded contact holes as described below. The method of making a multi-level printed circuit board is not discussed, as these methods, per se, are not the subject matter of the present invention and are well known in the art.

Formed in the first probe card member 31 is a probe site hole 40 which represents the location around which the probing circuitry of the probe card 30 is configured. The probe site hole 40 also serves as an aperture with which to visually check for correct alignment and connection of the probe pins to the semiconductor circuit test contact pads (not shown). This probe site hole 40 may be of any convenient geometrical shape, and is circular in the preferred embodiment illustrated. By the way of dimensional example, the probe site hole 40 may be typically formed to a diameter of 1.0 inch.

In the probing circuitry shown in FIG. 2A sample conductive lines 1', 3', F', 10' and 13' correspond to several of the conductive lines illustrated in the preferred printed circuit layout illustrated in FIG. 3A. These conductive lines terminate at the end of the first probe card member 31, providing a location where connection can be made to test equipment, microprocessor equipment, power supplies, etc. The connection to these conductive lines and the central ground plane G' can be made via discrete connections, or can be made in bulk using appropriate printed circuit board connectors which are well known in the art. the conductive lines 1', 3', F', 10', 13' are exemplary of probe pin lines which are formed to supply conductive probing circuit paths to be associated with each of a respective probe pin.

As can be seen from the printed circuit layout of FIGS. 3A and 3B, each of the probe pin lines in the preferred layout runs in a general direction toward the probe site hole 40; however, as the preferred embodiment is designed such that the probe pins are to mounted at periodic locations around the perimeter of the probe site hole 40, each of the probe pin lines runs to one of 48 different locations disposed around the probe site hole, to be associated with a respective one of 48 different probe pins (not shown).

As the present invention makes extensive use of contact holes, a discussion of this feature is in order. In the context of this application, a contact hole is a structure which provides a conduction path to a different plane of the printed circuit board. At the site of each terminal or contact hole, a hole is drilled through the printed circuit board. On the surface, the hole is surrounded by an area of conductive material to provide an area where a mechanical/electrical contact can be made. The hole is then plated-through with conductive material such that a conductive path is provided to the opposite side of the printed circuit board. On the opposite surface, the hole is again surrounded by an area of conductive material to provide an area where mechanical/electrical contact can be made.

The contact holes can be divided into grounded contact holes and non-grounded contact holes, which are now described in the stated order.

A grounded contact hole is a plated-through hole which provides a conduction path between the top and bottom surfaces of the printed circuit board, while at the same time being connected to the central ground plane. An example of such a contact hole can be most clearly seen as G connected to the central ground plane G' in FIG. 2B. To provide a grounded contact hole, no special provision is made as to the printed circuit layout of the central ground plane G'. As the hole is drilled through the first board 31*a* and the second board 31*b*, a hole is also drilled through the conductive material of the central ground plane G'. The conductive material of the central ground plane is thus exposed at the perimeter of the drilled hole. As electrolysis is conducted to deposit conductive material to plate-through the hole, conductive material is deposited on, and a conduction path is provided to, the central ground plane G'.

In contrast, a non-grounded contact hole is a plated-through hole which provides a conduction path between the top and bottom surfaces of the printed circuit board, while not being connected to any central ground plane. Examples of such contact holes can be most clearly seen as F, 53, 52 and 51 in FIG. 2B, and 53', 52' and 51' in FIG. 2C. To provide a non-grounded contact hole in a multi-layered printed circuit board (see e.g. FIG. 2B), a special provision is made as to the central ground plane. Before the first board 31*a* and second board 31*b* are bonded together to form the multi-layered board 31, conductive material is removed from the central ground plane layout at locations where non-grounded contact holes are desired. As can be most clearly seen in the preferred central ground plane G' of FIG. 3A, circular voids are created which are aligned to, and have a larger diameter than each of the desired non-grounded contact holes. Once the multi-layered board has been assembled, drilling is conducted at a desired location, to provide a hole which passes through the first board 31*a*, and second board 31*b*, and the void in the conductive material of the central ground plane G'. As the conductive material of the central ground plane G' is not exposed along any surfaces of the drilled hole, connection to the central ground plane G' is not made during the electrolysis process to plate-through the hole.

In addition to providing a conductive path between the oppostie surfaces of the printed circuit board, the contact hole serves several additional purposes.

First, it is often desirable to alter the probe card circuitry by connecting discrete electronic components (such as resistors and capacitors) between two contact holes, or between a contact hole and a ground plane. In these cases, the contact hole serves as a convenient and compact structure to receive the lead of the electrical component which may then be soldered in place.

Second, spring-loaded contact pins are often fixedly mounted to various contact holes. The contact hole again serves as a convenient and compact structure to receive the base of the spring loaded pin which may then be soldered in place.

Finally, various contact holes are also aligned to mechanically receive, and serve as electrical contact sites for, the contact tips of the spring-loaded pins. Thus, the hole again serves as a convenient and compact structure to receive and maintain contact with the contact tip.

In order to serve the above purposes, the contact hole should be of a sufficient diameter after plating to be able to receive each of the above structures.

As an example, the probing circuit associated with an exemplary probe pin 25 will now be more fully described with reference to FIG. 2A. On the first probe card member 31, there is formed a probe pin line F', which is associated with the probe pin 25, and a grounded contact hole G. The probe pin line F' terminates at the non-grounded terminal or contact hole 51.

A non-grounded contact hole 52 is formed without attachment to any conductive lines. The purpose of the contact hole 52 is to provide a convenient terminal with which to introduce a parallel ground branch into the probing circuit. In a preferred embodiment, the contact hole 52 is midway between the contact holes 51 and 53 and is aligned with a diameter drawn from the center of the probe site hole 40 through the grounded contact hole G. This diameter is designated by reference numeral 101 in FIGS. 3A and 3B.

Non-grounded contact hole 53 is formed with a conductive line connector 54 which, in turn, is connected to a non-grounded probe pin contact hole F (to be described below). In a preferred embodiment, the third contact hole 53 is aligned with a diameter which is drawn from the center of the probe site hole 40 through the first contact hole 51. This diameter is designated by reference numeral 102 in FIGS. 3A and 3B.

Electrically connected to the third contact hole 53 by the conductive line 54 is the non-grounded probe pin contact hole F which is used as the location at which to connect the exemplary probe pin 25 to the probe card 30. The probe pin 25 may be permanently soldered into the probe pin contact hole F or, alternatively, may be removably attachable. In a preferred embodiment the probe pin 25 is made removably attachable to facilitate its realignment to a different probing configuration. One probing pin structural arrangement which is very convenient to use with the present invention is that manufactured by R&K Corporation (California). In this structural arrangement, the probe pin is permanently attached and aligned with respect to a separate structure which conveniently plugs into the probe pin contact holes of the first probe card member.

In the probing circuit described thus far, note that the circuit, consisting of the probe pin line F', ground plane G', contact hole G, 51, 52, 53, the conductive line connector 54 and the probe pin contact hole F, represents an incomplete circuit; i.e., there is no complete electrical conduction path between the probe pin line F' and the probe pin contact hole F. The additional circuitry needed is supplied by additional structural components of the adapter ring 33.

In FIG. 2A, there is shown a partial cut away view of an adapter ring 33. This second component may correctly be called a second probe card member, second plate, adapter printed circuit board or adapter ring however, for the purposes of this application, the term "adapter ring" will be consistently used.

Like the first probe card member 31, the adapter ring also is a printed circuit board having printed circuits on both the top and bottom surfaces and plated-through contact holes. Cut away views of the top and bottom printed circuit layouts of the preferred embodiment can be seen in FIGS. 3D and 3E, respectively. The adapter ring 33 is also provided with a probe site hole 41 which exactly corresponds to the probe site hole 40 in the first probe card member 31. By way of dimensional examples, the adapter ring 33 can be formed from an epoxy board which is copper-plated to a resultant thickness of 0.125 inch, the ring having a major diameter of 3.00 inches and a probe site hole diameter of 1.00 inch. In contrast to the multi-layered construction of the first probe card member 31, the preferred adapter ring 33 is of a single printed circuit board layer.

Formed on the top surface of the adapter ring 33 is a T-shaped conductive circuit, the ends of which are terminated by the plated-through contact holes 51', 52' and 53'. These features of the adapter ring 33 can be most clearly seen in the enlarged cut away view of FIG. 2C. In contrast to the T-shaped conductive circuit connecting the contact holes on the top surface of the adapter ring, the contact holes 51', 52' and 53' on the bottom surface of the adapter ring 33 are surrounded only by a small conductive area. This feature of the adapter ring 33 can be most clearly seen in the preferred adapter ring layout of FIG. 3E.

In an assembled state, the adapter ring 33 is mounted in close proximity to the first probe card member 31. The contact holes 51', 52' and 53' are configured such that, if the adapter ring 33 is properly aligned to the first probe card member 31, these contact holes will align exactly with the contact holes 51, 52 and 53, respectively, of the first probe card member. To provide the necessary electrical connections between the two plates, spring-loaded contact pins 61, 62 and 63 are provided. In a preferred embodiment, the spring-loaded contact pin 61, 62 and 63 are inserted and fixedly soldered into the contact holes 51, 52 and 53, respectively. In contrast to the above permanent arrangement, the contact tips of the contact pins 61, 62 and 63 are spring-biased to engage the contact holes 51', 52' and 53'. This spring-biased engagement serves to promote good mechanical/electrical contact between the contact tips and the contact holes 51', 52' and 53' while allowing the adapter ring to be replaceable. Spring-loaded contact pins, which are suitable for use with the present invention, are commercially available from Pylon Corporation (Massachusetts) under the tradename "Pogo-pins". An alternative suitable spring-loaded contact pin is the switching probe disclosed in *IBM Technical Disclosure Bulletin*, Volume 18, No. 8, dated January 1976, entitled "Switching Probe", and authored by R. W. Beck.

To prevent mechanical damage to the spring-loaded contact pins 61, 62 and 63, there is provided a spacer ring 32 of sufficient thickness such that the approach of the adapter ring 33 toward the first probe card member 31 is limited before exceeding the compression range of the pins 61, 62 and 63.

The spacer ring 32 also serves an additional purpose of supplying an electrical conduction path between the two probe cards members. In this regard, around the circumference of the probe site hole 41 of the adapter ring 33 is a conductive central ground region 46. Similarly, there is a conductive central ground region 45 surrounding the circumference of the probe site hole 40 of the first probe card member 31. These central ground regions are often used as a ground plane with which to connect discrete electronic components (e.g., resistors and capacitors). In order to maintain good ground contact between these two central ground regions 45 and 46, the spacer ring should be of a conductive material. In the preferred embodiment, the spacer ring is made of gold-plated brass. By way of dimensional examples, the spacer ring 32, as detailed in FIG. 3C, can be formed to a thickness of 0.215 inch, a major diameter of 1.50 inches, and an internal diameter of 1.250 inches. The major diameter of the spacer ring 32 may be increased and holes appropriately located to provide a controlled impedance connection path between the adapter ring 33 and first probe card member 31.

In order to facilitate the removable attachment of the adapter ring 33 to the first probe card member, any well known attachment means may be used as long as an electrically conductive path is maintained between the central ground regions 45 and 46. In the preferred embodiment attachment holes are provided through the conductive central ground regions 45, 46 and also through the spacer ring 32. A screw 50 and thread arrangement (not shown) is then used to screw together the probe card members and the spacer ring.

In addition to the central ground regions 45 and 46, ground regions can additionally be provided on surface areas of the probe card member 31 which are not occupied by conductive lines. These ground regions, which are shown as G'' in the top layout of FIG. 3A and as G''' in the bottom layout of FIG. 3B, are connected to the central ground plane G' by the use of grounded contact holes. Although these extra ground regions provide convenient locations for ground connections during testing and trouble-shooting, these regions may be omitted without impact to the operation of the probe card device.

Having completed a description of the main structural components and arrangements, let us now turn to a detailed description of a complete probing circuit. If the adapter ring 33 is properly mounted to the first probe card member 31 by using the spring-loaded contact pins 61, 62, and 63, a complete series electrical path from the conductive line F' to the probe pin contact hole F is formed. This series electrical path is comprised of the probe pin line F', first contact hole 51, spring-loaded contact pin 61 and contact hole 51', the T-shaped conductive line, contact hole 53' spring-loaded contact pin 63, contact hole 53, and the conductive line connector 54. Thus, with regard to the exemplary probing circuit, a series electrical path to a respective probe pin 25 has been provided.

Let us now turn to a description of the reconfiguration of the probing circuits. An important feature is that the T-shaped conductive lines are actually constructed of several "lands." A "land" in this context is defined as a strip of conductive material formed on the surface of the printed circuit board the electrical conduction path of the strip being interruptable by severing or removing a portion of the land. Typically, this can be easily done using a variety of tools, for example, a file or a sharp knife. In order to define the respective "lands" for the purpose of the description, the intersection point of the T-shaped conductive circuit is referenced as a point 55'. This can be most dearly seen in the enlarged cut away view of FIG. 2C. Right, left and lower "lands" are defined as the conductive material between the contact hole 51' and the point 55', the contact hole 53' and the point 55', and the contact hole 52' and the point 55' respectively.

In addition to the severable "lands", another important reconfiguration feature of the present invention to note is that discrete electronic components (e.g., resistors and capacitors) can be soldered between respective contact holes or between a respective contact hole and a ground plane. In the illustration of FIG. 2A, dashed lines are used to indicate four exemplary locations where discrete electronic components $E_1$–$E_4$, respectively, can be connected. These four possible connections, which will now be described in detail, are by no means meant to be exhaustive.

As a first alternative, discrete electronic component $E_1$ can be soldered between the contact holes 52 and G to introduce a parallel circuit branch from the T-shaped conductive circuit to a ground plane.

In a second alternative, electronic component $E_2$ can be soldered on the bottom surface of the first probe card member 31, between the contact holes 51 and 53, or the electronic component $E_3$ can be soldered on the top surface of the adapter ring 33 between the contact holes 51' and 53'. Although these two arrangements are electrically equivalent the soldering of the component $E_3$ on the top surface of the adapting ring 33 is preferred as an arrangement that allows the greatest flexibility in reconfiguring the probing circuit by a simple change of the adapter ring 33. In contrast, the soldering of the component $E_2$ on the bottom surface of the first probe card member 31 is preferred in applications where it is desired to maintain a series electrical path during times when the adapter ring is removed. In order to introduce the resistance or capacitance of the component $E_2$ or $E_3$ into the probing circuit, it should be noted that the right or left "land" must be severed in order to interrupt the short circuit across the component leads.

As a final alternative, electronic component $E_4$ can be soldered on the top surface of the adapter ring 33 between the contact hole 53' and the central ground region 46. The effect of this connection is to introduce a parallel path from the T-shaped conductive circuit to ground. This alternative is desirable in allowing probe circuit reconfiguration by a simple change of the adapter ring.

The above severable lands and electronic components features of the present invention will now be described in various combinations to illustrate four exemplary probing circuits. These circuits will be described with reference to the simplified schematic diagrams of FIGS. 4A–4D, and the simplified equivalent circuit of FIGS. 5A–5D.

Figure 4A:
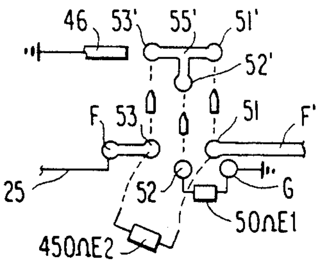
FIGS. 4A–4D are simplified schematic circuit diagrams of exemplary probing circuits which can be configured in occordance with a preferred embodiment of the present invention.

In the first probing circuit of FIG. 4A, a 50 ohm resistor $E_1$ has been soldered between the contact holes 52 and G to introduce a parallel resistive path from the T-shaped conductive circuit to ground. Note that the 450 ohm resistor $E_2$ is not part of the electrical circuit, as it is effectively short circuited by the unsevered right and left "lands." The result is a "Terminated Input Line" probing circuit as illustrated in the equivalent circuit of FIG. 5A.

Figure 4B:
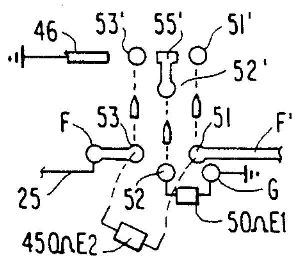
Figure 5A:
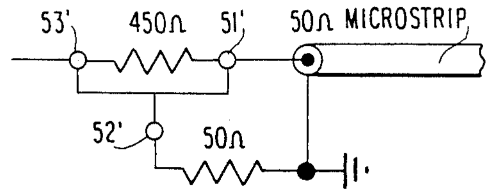
FIGS. 5A–5D are simplified equivalent circuit diagrams corresponding to the exemplary probing circuits of FIGS. 4A–4D.
Figure 5B:
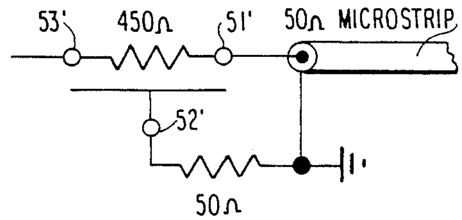

In the second probing circuit example of FIG. 4B, a 450 ohm resistor $E_2$ has been introduced into the circuit, and the parallel circuit consisting of a 50 ohm resistor $E_1$ has been removed by a severing of the right and left "lands." The result is an "Output Probe Line" probing circuit as illustrated in the equivalent circuit of the FIG. 5B.

Figure 4C:
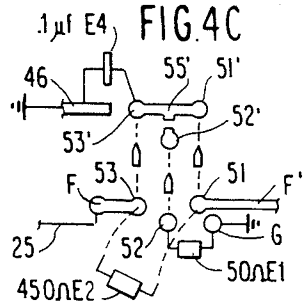
Figure 5C:
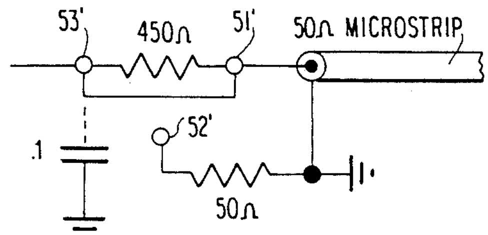

In the third probing circuit example of FIG. 4C, a parallel circuit from the T-shaped circuit to ground has been introduced by the 0.1 microfarad capacitor $E_4$, and the parallel circuit consisting of a 50 ohm resistor $E_1$ has been removed by severing the bottom "land." Note that the 450 ohm resistor $E_2$ again is not part of the electrical circuit as it is effectively short-circuited by the right and left "lands." The result is a "None-Terminated Input-/Output Line" probing circuit as illustrated in the equivalent circuit of FIG. 5C.

Figure 4D:
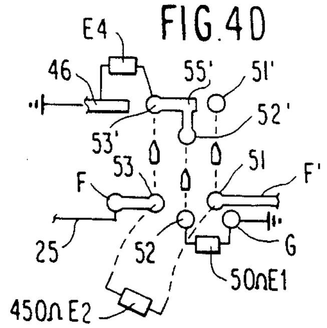
Figure 5D:
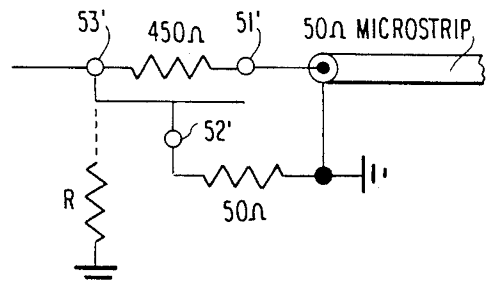

In the final probing circuit example of FIG. 4D, a "Current Sense Probe" circuit is constructed by providing the series/parallel resistive circuit when the resistors $E_1$, $E_2$, and $E_4$ are connected as shown, and the right "land" is severed. The resultant equivalent circuit is shown in FIG. 5D.

Thus, it should now be apparent that the severable land and electronic component connection features of the present invention can be applied to the adapter ring 33 so that the probe card circuitry of the probe card apparatus 30 can be changed by simply changing the adapter ring 33. It should be noted that in changing the adapter ring 33 to reconfigure the probing circuitry, up to 48 adapter ring circuits will be changed with respect to the associated probe card member circuits.

In order to insure that the respective adapter ring circuits are aligned and connected to the correct probe card member circuit, some alignment mechanism between the adapting ring 33 and the first probe card member 31 must be provided. In the preferred embodiment illustrated, this alignment mechanism is provided by omitting probing circuitry from corresponding locations such that the adapter ring 33 and the first probe card member 31 are "keyed" to one other. Any other well known method of insuring that these members are placed in the correct relative positions may be used, for example, using an adapter ring of a unique geometrical shape (e.g., a square, triangle, etc.).

In the above description, it was assumed that all of the 48 probing circuits of the probe card 30 were to be used during a connection to the semiconductor circuit such that the entire adapter ring 33 must be dedicated to reconfigure the probing circuit. If fewer than the total number of available probing circuits is needed to make the required connections, then an adapter ring can be used to effect several reconfigurations. As one example of variant, the adapter ring could be divided into quadrants, each quadrant being dedicated to a different reconfiguration. Reconfiguration would thus be effected by rotating the adapter ring 90° . In this example, a square adapter member 33, constituting a geometrical keying, would work particularly well.

In conclusion, there has been disclosed a probe card apparatus and a method of reconfiguring the probing circuitry whereby the probing circuitry can be reconfigured without disrupting connection to the semiconductor circuit, and without disturbing the critical alignment of the probe pins. These results are accomplished by providing a first probe care member with a plurality of incomplete probing circuits which are associated with a plurality of contact holes. An adapter ring having T-shaped conductive lines terminated with contact holes is mounted in close proximity to the first probe card member, and spring-loaded contact pins are used to complete the probing circuit. The adapter ring also includes severable "lands" and electronic component connections sites which allow the custom reconfiguration of each of the individual probing circuits. As the reconfiguration of the individual probing circuit can be performed by making changes to the adapter ring, the entire probe card circuitry of the probe card apparatus can be quickly reconfigured by simple changing the adapter ring.

It is to be understood that, while modifications can be made to the structures and teachings of the present invention as described above, such modifications fall within the spirit and scope of the present invention as defined in the claims appended hereto.

What is claimed is:

1. A probe card apparatus for allowing connection to miniature test contact pads of an integrated circuit on a surface of a semiconductor substrate, said probe card apparatus comprising:

a first probe card member having a plurality of interrupted probe pin circuits, each of said probe pin circuits having associated therewith first contact means for use in providing electrical connection to a probe pin, second contact means, and third contact means for providing electrical connection to test equipment; and a second probe card member having a plurality of adaptor circuits, each of said adaptor circuits having fourth contact means for electrically connecting to said first contact means, fifth contact means for electrically connecting to said second contact means, sixth contact means for electrically connecting to said third contact means, and conductive line means for providing electrical connection between said fourth, fifth and sixth contact means;

said second probe card member being placeable in at least one position relative to said first probe card member, such that said fourth, fifth and sixth contact means of at least a portion of said plurality of adaptor circuits are aligned and electrically connected to said first, second and third contact means, respectively, of at least a portion of said plurality of probe pin circuits, said probe card apparatus being configurable to a desired probe card circuitry by removably mounting a preselected second probe card member.

2. A probe card apparatus as claimed in claim 1, further comprising means for removably attaching said second probe card member to said first probe card member.

3. A probe card apparatus as claimed in claim 1, further comprising a plurality of spring-loaded pins, each spring-loaded pin being respectively disposed to provide electrical connection between one of said first, second and third contact means and a corresponding one of said fourth, fifth and six contact means, respectively.

4. A probe card apparatus as claimed in claim 3, wherein one end of each respective spring-loaded pin of said plurality of spring-loaded pins is fixedly mounted to a respective one of said first, second, third, fourth, fifth and sixth contact means.

5. A probe card apparatus as claimed in claim 3, further comprising a spacer ring placeable between said first and second probe card members to prevent said spring-loaded pins from being excessively compressed.

6. A probe card apparatus as claimed in claim 1, said conductive line means being severable to interrupt electrical connection between said fourth, fifth and sixth contact means.

7. A probe card apparatus as clained in claim 1, wherein each of said first, second, third, fourth, fifth and sixth contact means is of a construction which allows connection of discrete electronic components and spring-loaded contact pins.

8. A probe card apparatus as claimed in claim 9, wherein said second probe card member is placeable, in said at least one position, on a major surface of said first probe card member opposing a major surface upon which said probe pin means are removably attachable such that said second probe card member can be changed to reconfigure circuitry of said probe card apparatus without disturbing said probe pin means.

9. A probe card apparatus as claimed in claim 1, further comprising probe pin means which are removably attachable to said first probe card member.

10. A probe card apparatus as claimed in claim 1, wherein said first contact means, said fourth contact means, a portion of said conductive line means providing electrical connection between said fourth and sixth contact means, and said sixth contact means of a probing circuit represents series circuit means for providing a series connection between said first and sixth contact means, and wherein a portion of said conductive line means between said fifth contact means and said fourth or sixth contact means, said fifth contact means and said second contact means represents parallel circuit means for providing a parallel connection between said series circuit means and a ground contact means.

11. Probe card apparatus for allowing connection to miniature test contact pads of an integrated circuit on a surface of a semiconductor substrate, said probe card apparatus comprising:

first probe card plate means having a plurality of interrupted probe pin circuits disposed around and radiating in directions away from viewing aperture means, each of said probe pin circuits having associated therewith first contact means for use in providing electrical connection to a probe pin, second contact means, and third contact means for providing electrical connection to test equipment; and second probe card plate means having a plurality of adaptor circuits, each of said adaptor circuits having fourth contact means for electrically connecting to said first contact means, fifth contact means for electrically connecting to said second contact means, sixth contact means for electrically connecting to said third contact means, and conductive line means for providing electrical connection between said fourth, fifth and sixth contact means;

said second probe card plate means being removably placeable in at least one position relative to said first probe card plate means, such that said fourth, fifth and sixth contact means of at least a portion of said plurality of adaptor circuits are aligned and electrically connected to said first, second and third contact means, respectively, of at least a portion of said plurality of probe pin circuits, said conductive line means being severable to interrupt electrical connection between said fourth, fifth and sixth contact means, and said first, second, third, fourth, fifth and sixth contact means being of a construction which allows connection of discrete electronic components, said probe card apparatus being configurable to a desired probe card circuitry by removably mounting a preselected second probe card plate means.

12. Probe card apparatus as claimed in claim 11 further comprising means for removably connecting said second probe card plate means to said first probe card plate means.

13. Probe card apparatus as claimed in claim 12 further comprising a plurality of spring-loaded pins, each spring-loaded pin being respectively disposed to provide electrical communication between one of said first, second, third contact means and a corresponding one of said fourth, fifth, sixth contact means, respectively.

14. Probe card apparatus as claimed in claim 13 wherein each respective pin of said plurality of spring loaded pins is fixedly mounted to one of said first, second and third contact means.

15. Probe card apparatus as claimed in claim 11 further comprising probe pin means which are removably attachable to said first probe card plate means.

16. Probe card apparatus as claimed in claim 15 wherein said second probe card plate means is placeable, in said at least one position, on a major surface of said first probe card plate means opposing a major surface upon which said probe pin means are removably attachable such that said second probe card member can be changed to reconfigure circuitry of said probe card apparatus without disturbing said probe pin means.

17. A method of providing a reconfigurable probe card apparatus for allowing connection to miniature test contact pads of an integrated circuit on a surface of a semiconductor substrate, said method comprising the steps of:

providing a plurality of incomplete first probing circuits on a first probe card member, each of said probing circuits having associated therewith first contact means for use in providing electrical connection to a probe pin, second contact means, and third contact means for providing electrical connection to test equipment;

providing a plurality of second probing circuits on a second probe card member, each of said second probing circuits having fourth contact means for electrically connecting to said first contact means, fifth contact means for electrically connecting to said second contact means, sixth contact means for electrically connecting to said third contact means, and conductive line means for providing electrical connection between said fourth, fifth and sixth contact means;

removably mounting said second probe card member in a position relative to said first probe card member such that said fourth, fifth and sixth contact means of at least a portion of said second probing circuits are aligned to and placed in electrical communication with said first, second and third contact means, respectively, of at least a portion of said first probing circuits, such that said probe card apparatus is configurable to a desired probe card circuitry by the removable mounting of a preselected second probe card member.

18. A method as claimed in claim 17, further comprising the step of providing a plurality of spring-loaded contact pins, each respective spring-loaded pin being disposed to provide electrical connection between one of said first, second and third contact means and a corresponding one of said fourth, fifth and sixth contact means, respectively.

19. A method as claimed in claim 18, further comprising the step of providing a spacer ring between said first and second probe card members to prevent said spring-loaded pins from being excessively compressed.

20. A method as claimed inclaim 17, wherein said conductive line means are severable conductive lines.

21. A method as claimed in claim 17, wherein said second probe card member is removably mountable on a major surface of said first probe card member opposing a major surface upon which said probe pin means are removably attachable such that said second probe card member can be changed to reconfigure circuitry of said probe card apparatus without disturbing said probe pin means.

* * * * *

UNITED STATES PATENT AND TRADEMARK OFFICE
CERTIFICATE OF CORRECTION

PATENT NO. : 4,862,077

DATED : August 29, 1989

INVENTOR(S) : Timothy A. Horel, Edward S. Hoyt and Llyod A. Walls

It is certified that error appears in the above-identified patent and that said Letters Patent is hereby corrected as shown below:

Column 13, line 32, delete "clained" and insert --claimed--
(Claim 7, line 1)

Signed and Sealed this

Twenty-second Day of January, 1991

*Attest:*

HARRY F. MANBECK, JR.

*Attesting Officer*

*Commissioner of Patents and Trademarks*